United States Patent
Nagata et al.

(10) Patent No.: US 10,024,883 B2
(45) Date of Patent: Jul. 17, 2018

(54) CONTACT UNIT AND INSPECTION JIG

(71) Applicants: Yokowo Co., Ltd., Tokyo (JP); Murata Manufacturing Co., Ltd., Kyoto (JP)

(72) Inventors: Takahiro Nagata, Gunma (JP); Takeshi Todoroki, Gunma (JP); Takahiro Nakamura, Gunma (JP); Yoshinori Ishikawa, Kyoto (JP); Takayuki Kawano, Kyoto (JP); Kazuhisa Honma, Kyoto (JP)

(73) Assignees: Yokowo Co., Ltd., Tokyo (JP); Murata Manufacturing Co., Ltd., Kyoto (JP)

( * ) Notice: Subject to any disclaimer, the term of this patent is extended or adjusted under 35 U.S.C. 154(b) by 171 days.

(21) Appl. No.: 15/077,993

(22) Filed: Mar. 23, 2016

(65) Prior Publication Data
US 2016/0282386 A1     Sep. 29, 2016

(30) Foreign Application Priority Data

Mar. 27, 2015   (JP) ................................ 2015-067307
Oct. 30, 2015   (JP) ................................ 2015-214738

(51) Int. Cl.
G01R 31/28  (2006.01)
G01R 1/067  (2006.01)
G01R 1/04   (2006.01)

(52) U.S. Cl.
CPC ....... G01R 1/06755 (2013.01); G01R 1/0466 (2013.01)

(58) Field of Classification Search
CPC .... G01R 31/28; G01R 1/067; G01R 1/06711; G01R 1/073; G01R 1/07307; G01R 1/07342; G01R 35/00; G01R 1/06772; G01R 1/0735; G01R 31/2891; G01R 31/2831; G01R 1/06755; G01R 1/0466
See application file for complete search history.

(56) References Cited

U.S. PATENT DOCUMENTS

| 2001/0019276 A1* | 9/2001 | Yoshida ............. G01R 1/07342 324/755.01 |
| 2004/0046579 A1* | 3/2004 | Chraft ................ G01R 1/07314 324/750.27 |
| 2007/0296431 A1 | 12/2007 | Gleason et al. |
| 2010/0170700 A1* | 7/2010 | Nakamura ............. H05K 1/183 174/254 |

FOREIGN PATENT DOCUMENTS

JP          2006-177971 A      7/2006

* cited by examiner

Primary Examiner — Son Le
(74) Attorney, Agent, or Firm — Leydig Voit and Mayer

(57) ABSTRACT

A block has a planar portion abutting a back side of a contact region of a flexible substrate, and a recess that is concave with respect to the planar portion. An electronic component mounted on the flexible substrate is located within the recess. When viewed from a direction perpendicular to the planar portion, the recess is located at a position near a power supply bump, except at a position overlapping the power supply bump, or the recess is filled with a filler. The planar portion of the block abuts only the back side of the power supply bump.

20 Claims, 10 Drawing Sheets

1 INSPECTION JIG (PROBE CARD)

1 INSPECTION JIG (PROBE CARD)

1 INSPECTION JIG (PROBE CARD)

1 INSPECTION JIG (PROBE CARD)

40 FLEXIBLE SUBSTRATE (TEST OBJECT SIDE)

40 FLEXIBLE SUBSTRATE (TESTER SIDE)

CONTACT UNIT AND INSPECTION JIG

BACKGROUND OF THE INVENTION

Field of the Invention

The present invention relates to a contact unit and an inspection jig such as a probe card which are used for inspecting electrical performance of a semiconductor integrated circuit, for example.

Description of the Related Art

In general, an inspection jig such as a probe card which is used for inspecting electrical performance of a semiconductor integrated circuit includes a flexible substrate having contact portions in contact with electrodes of an object to be inspected (e.g. wafer). The flexible substrate has a block for pressing the flexible substrate against the object to be inspected on a back side which is an opposite side from a side where the contact portions are provided. The block is urged by an urging means such as a spring toward the object to be inspected, to impart a contact force with the object to be inspected to the flexible substrate.

On the occasion of inspecting the electrical performance, electrical signals at high frequency are transmitted between the inspection jig and an inspection apparatus (a tester) by way of a coaxial cable. The inspection jig is provided with a coaxial connector for detachably connecting the coaxial cable which is extended from the tester. The coaxial connector is electrically connected to the flexible substrate by soldering or the like. An electrical connection between the contact portion of the flexible substrate and the coaxial connector is achieved by a conductive pattern provided on the flexible substrate.

Patent Literature 1

Japanese Unexamined Patent Application Publication No. 2006-177971

The conductive pattern drawn from the contact portion on the flexible substrate has an inductance. Recently, it has become a problem that an influence of noise arising from the inductance of the conductive pattern since the increased speed (heightened frequency) of signals handled in measurements of the inspection jig has been progressing. A possible measure to reduce noise is to dispose a bypass capacitor. Though the bypass capacitor has a higher noise removal effect according as it comes closer to the contact portion, it is necessary for the bypass capacitor to be disposed apart more than a certain distance from the contact portion in order to avoid interference with the object to be inspected during the measurements. In the case of high-speed signals of several GHz, if the bypass capacitor is apart from the contact portion, it is difficult to make accurate measurements under the influence of noise on the conductive pattern between the bypass capacitor and the contact portion.

SUMMARY OF THE INVENTION

The present invention has been made in view of the above described circumstances, and an object thereof is to provide a contact unit and an inspection jig, capable of making accurate measurements even in the case of high-frequency signals.

An aspect of the present invention is a contact unit which can be attached to or detached from a main body of an inspection jig. The contact unit comprises:

a flexible substrate provided on one face with a contact portion with respect to an object to be inspected;

a support member supporting the flexible substrate; and a block provided on the other face of the flexible substrate, the block having a planar portion abutting on a back side of the contact portion of the flexible substrate, and a recess concaved from the planar portion, an electronic component electrically connected to the contact portion being provided on the other face of the flexible substrate, the electronic component being located within the recess of the block.

Another aspect of the present invention is an inspection jig. The inspection jig comprises:

a flexible substrate provided on one face with a contact portion with respect to an object to be inspected;

a support member supporting the flexible substrate; and a block provided on the other face of the flexible substrate, the block having a planar portion abutting on a back side of the contact portion of the flexible substrate, and a recess concaved from the planar portion, an electronic component electrically connected to the contact portion being provided on the other face of the flexible substrate, the electronic component being located within the recess of the block.

The recess may be provided at a position in the vicinity of the contact portion which is electrically connected to the electronic component except an overlapping position with the contact portion, when viewed from a direction perpendicular to the planar portion of the block.

The flexible substrate may have a conductive pattern electrically connected to the contact portion, and a ground pattern on the other face, and the electronic component is provided across the conductive pattern and the ground pattern.

The recess may be filled with an insulating filler.

The contact portion electrically connected to the electronic component may be a power supply contact portion.

The inspection jig may comprise an urging member urging the block toward the object to be inspected.

Any arbitrary combination of the above-described constituent elements and the descriptions of the present invention which are converted between methods and systems are all effective as aspects of the present invention.

According to the present invention, it can be provided a contact unit and an inspection jig which are capable of making accurate measurements even in the case of high-frequency signals.

DETAILED DESCRIPTION OF THE INVENTION

Figure 1:
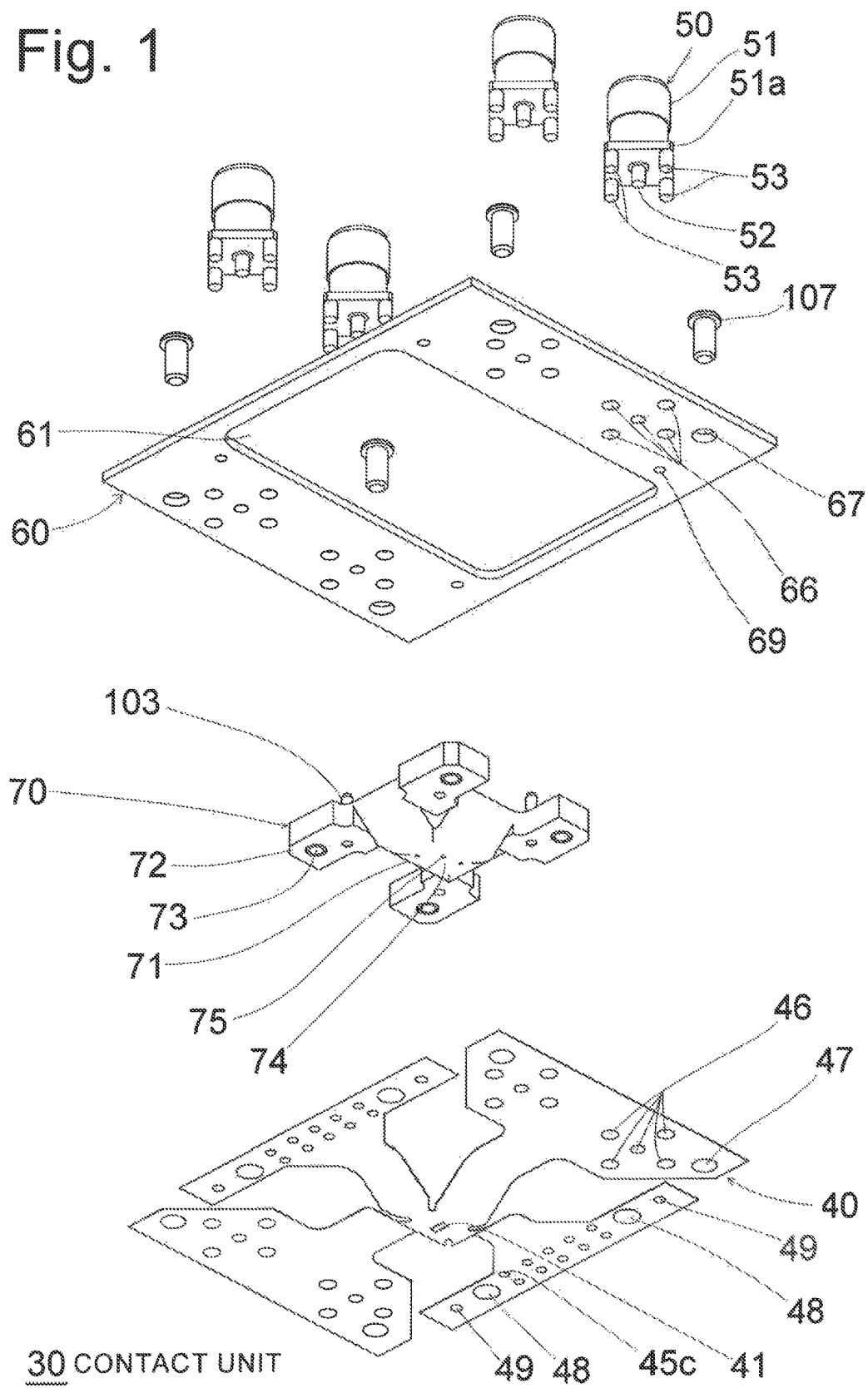
FIG. 1 is an exploded perspective view of a contact unit 30 according to a first embodiment of the present invention, as seen from the above.

Now, preferred embodiments of the present invention will be described in detail, referring to the drawings. The same or equivalent constituent elements, members and so on which are shown in the respective drawings are denoted with the same reference numerals, and overlapped descriptions are appropriately omitted. Moreover, the present invention is not limited to the embodiments, but the embodiments are only examples. All features and the combinations of the features which are described in the embodiments are not absolutely essential to the present invention.

First Embodiment

Figure 2:
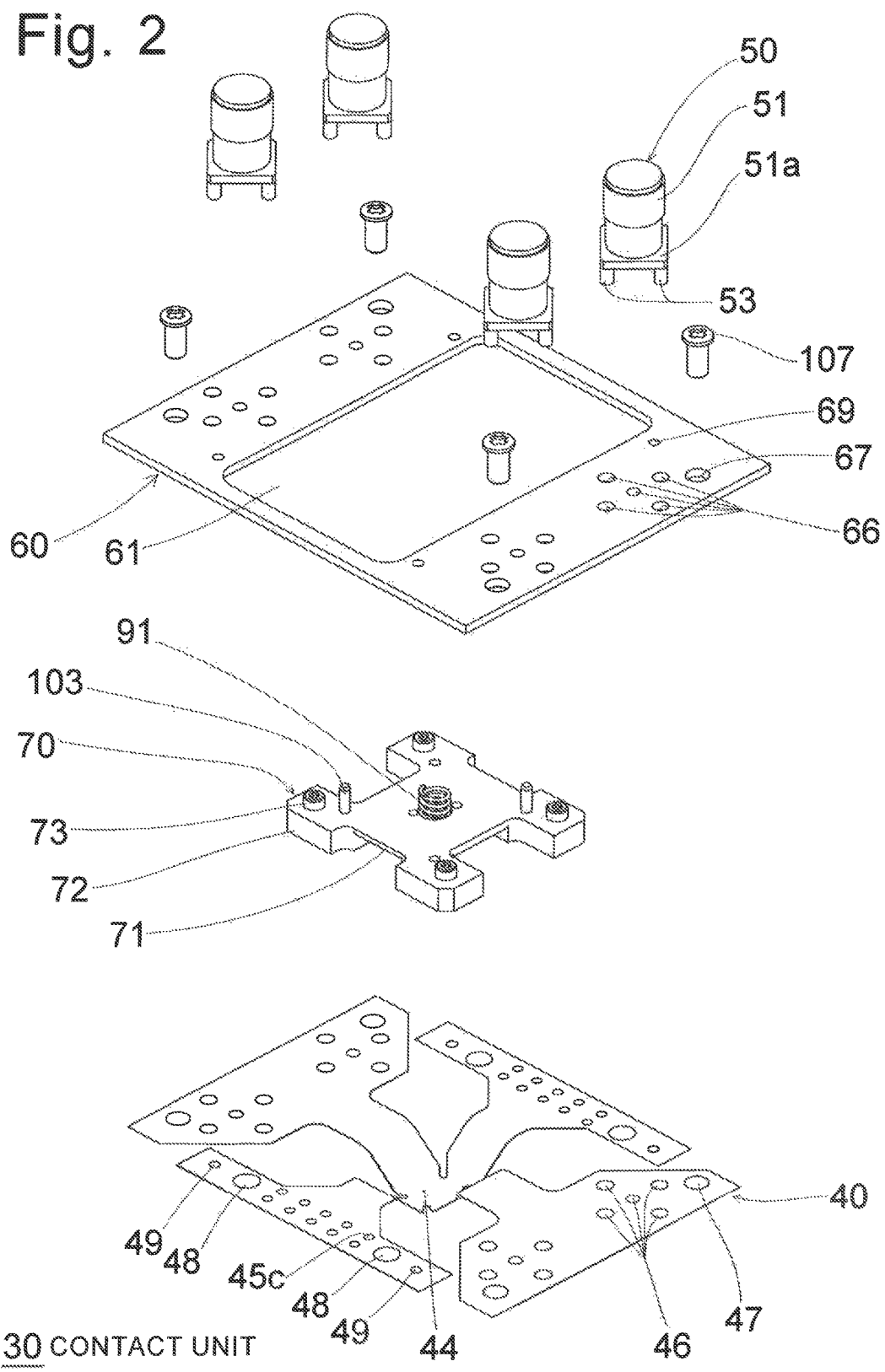
FIG. 2 is an exploded perspective view of the contact unit 30, as seen from the below.
Figure 3:
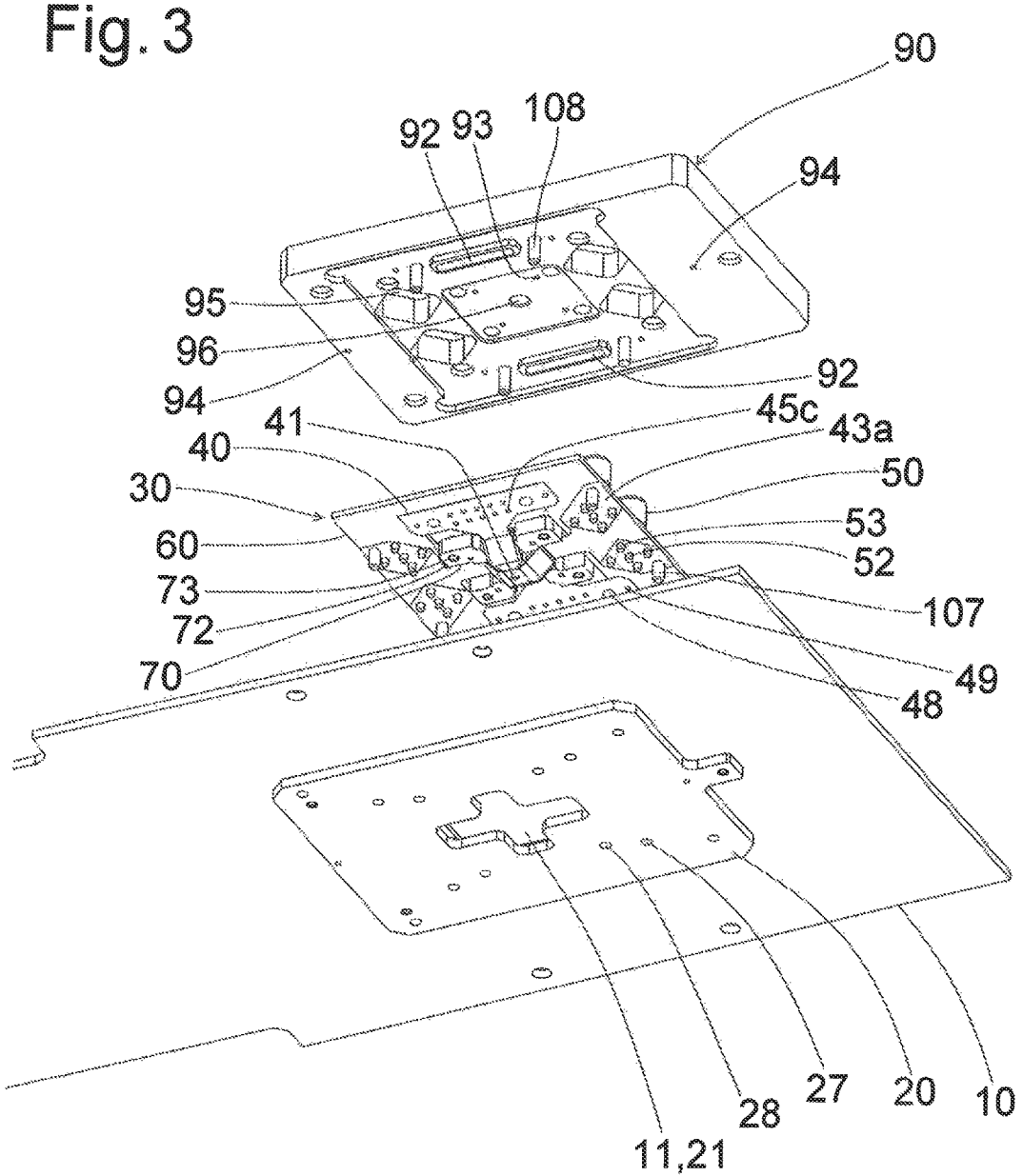
FIG. 3 is an exploded perspective view of an inspection jig 1 according to the first embodiment of the present invention, as seen from the above.
Figure 4:
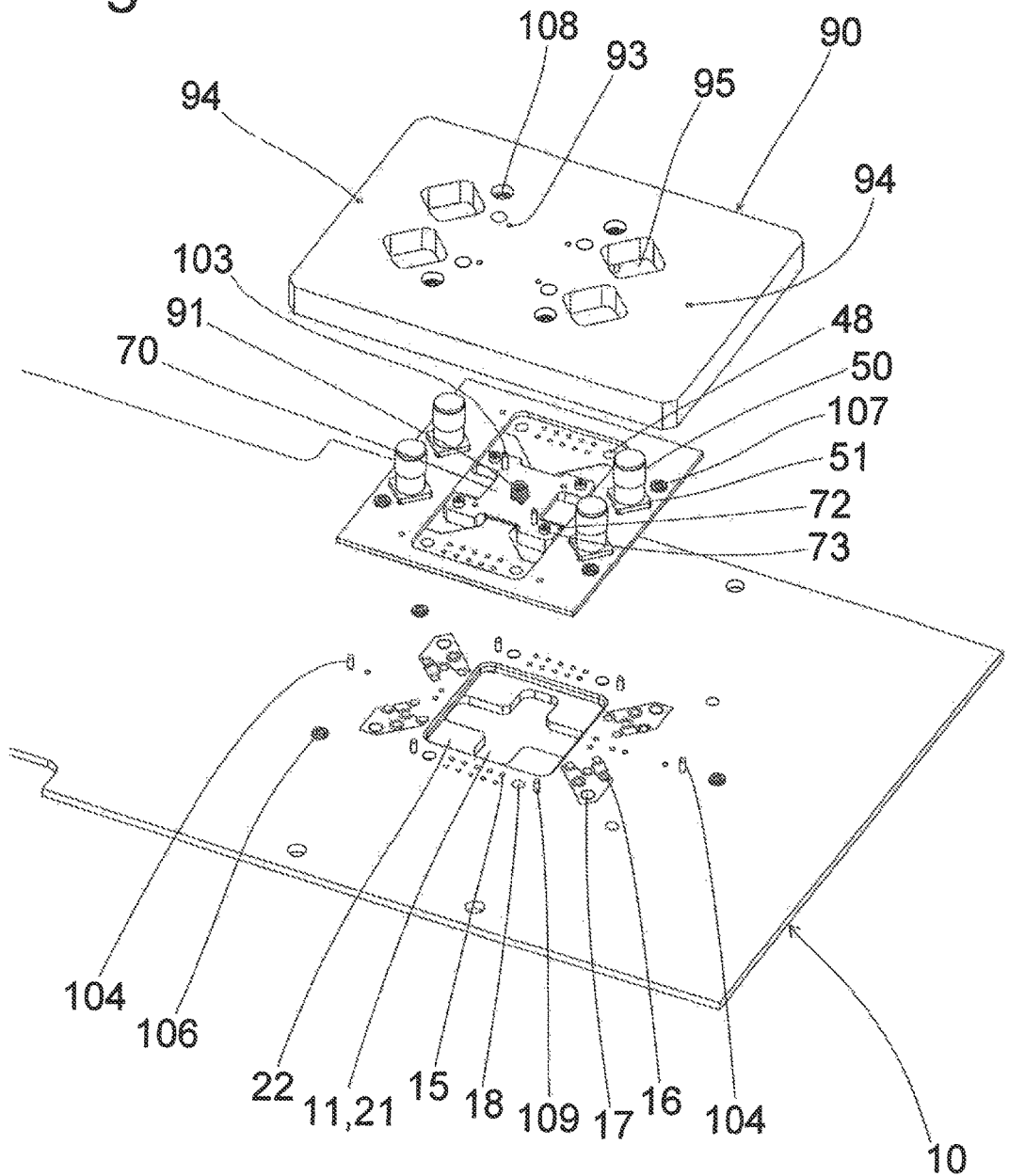
FIG. 4 is an exploded perspective view of the inspection jig 1, as seen from the below.
Figure 5:
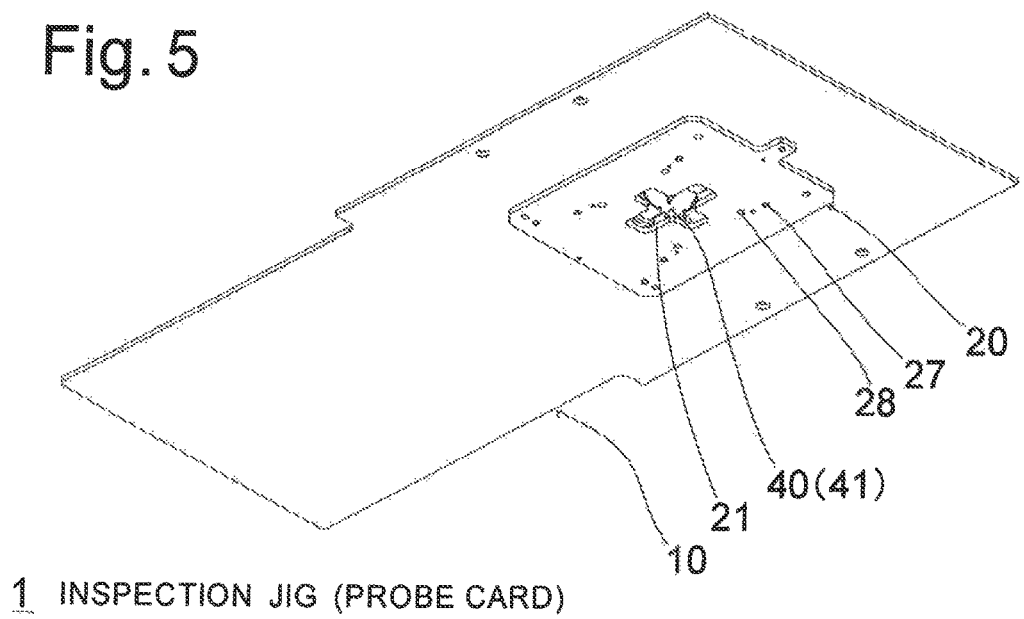
FIG. 5 is a perspective view of the inspection jig 1 in which a unit pressing member 90 is omitted, as seen from the above.
Figure 6:
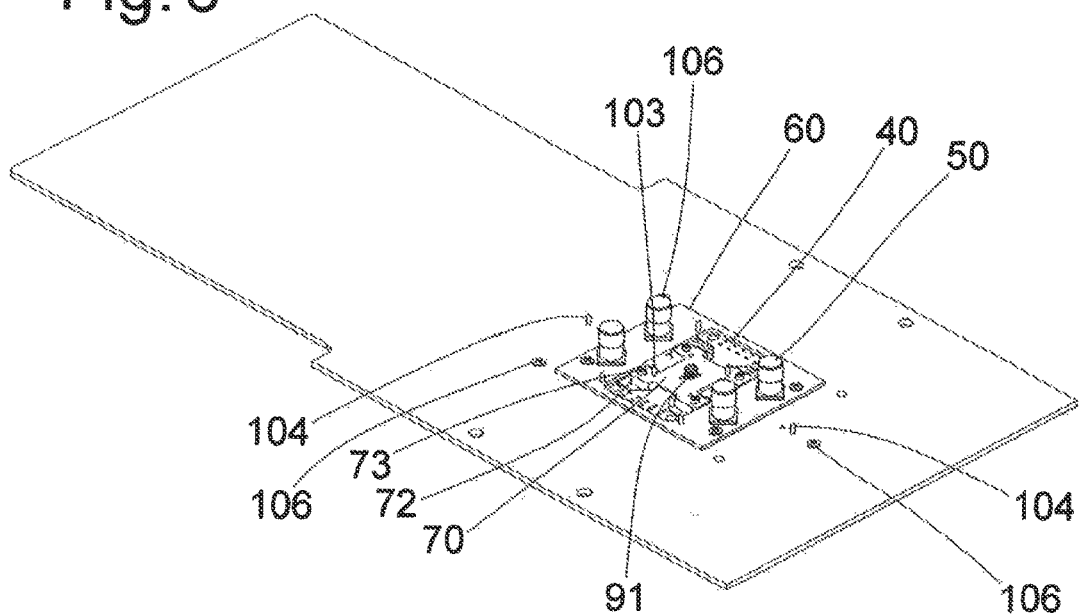
FIG. 6 is a perspective view of the inspection jig 1 in which the unit pressing member 90 is omitted, as seen from the below.
Figure 7:
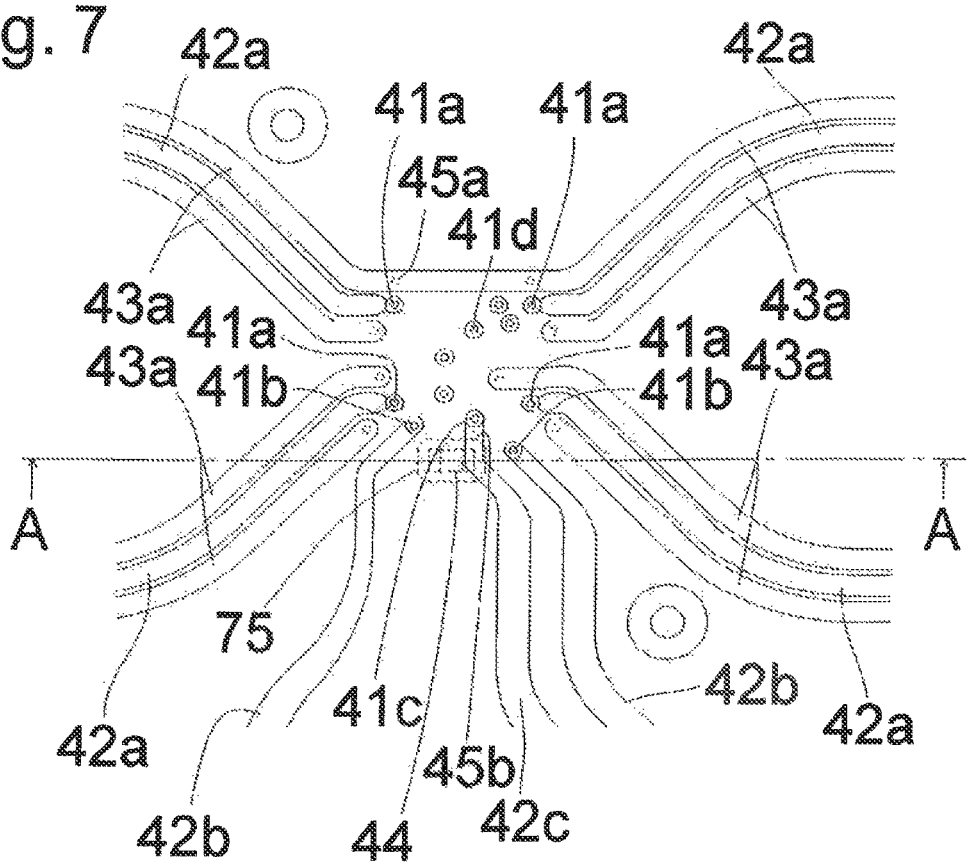
FIG. 7 is an enlarged view of a central portion of a face (a lower face), which is a face side of an object to be inspected, of a flexible substrate 40 of the inspection jig 1.
Figure 8:
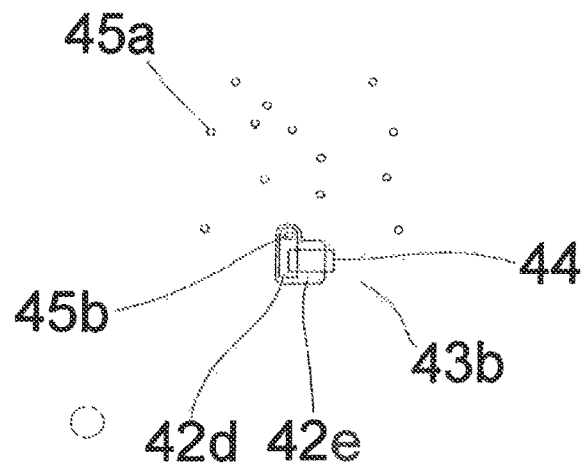
FIG. 8 is an enlarged view of a central portion of a face (an upper face), which is a face side of a tester, of the flexible substrate 40.
Figure 9:
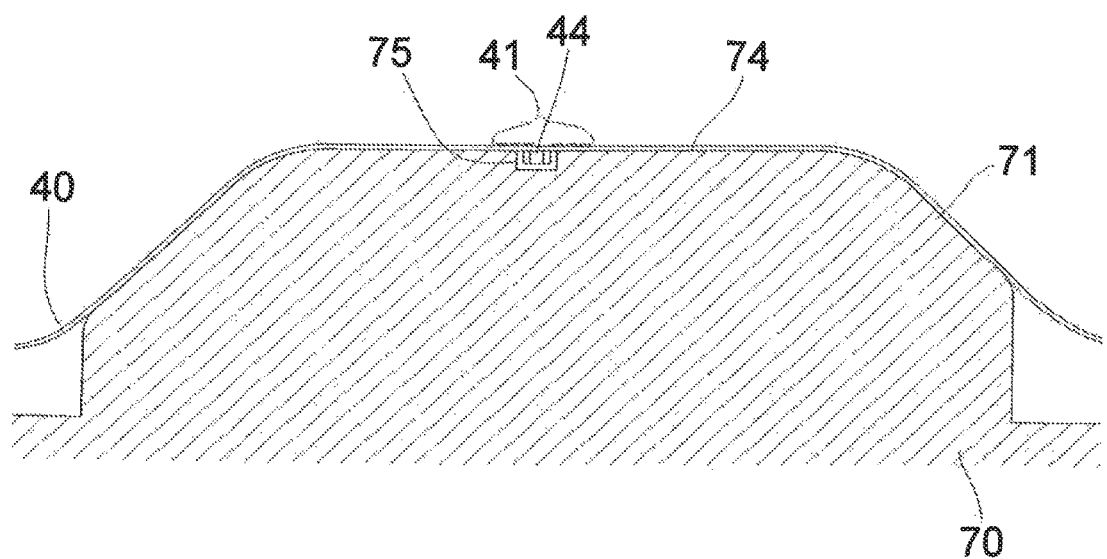
FIG. 9 is an enlarged sectional view taken along a line A-A in FIG. 7 in a state incorporated in a block 70.
Figure 10:
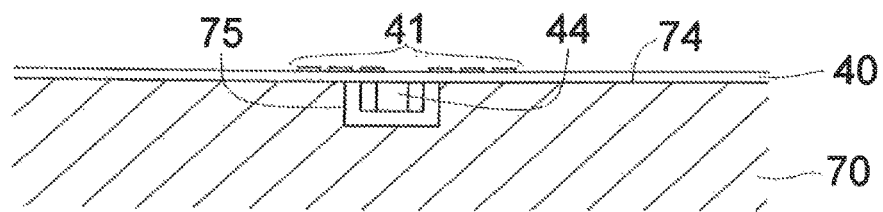
FIG. 10 is an enlarged view of an electronic component 44 in FIG. 9 and the periphery thereof.
Figure 11:
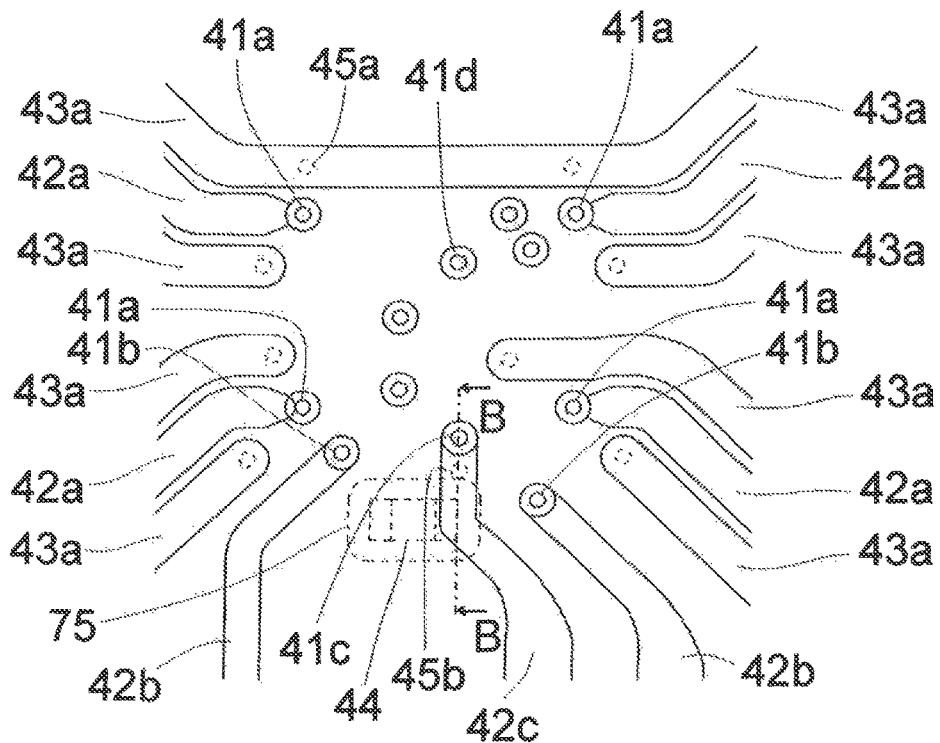
FIG. 11 is an enlarged view where the central portion in FIG. 7 is further enlarged.
Figure 12:
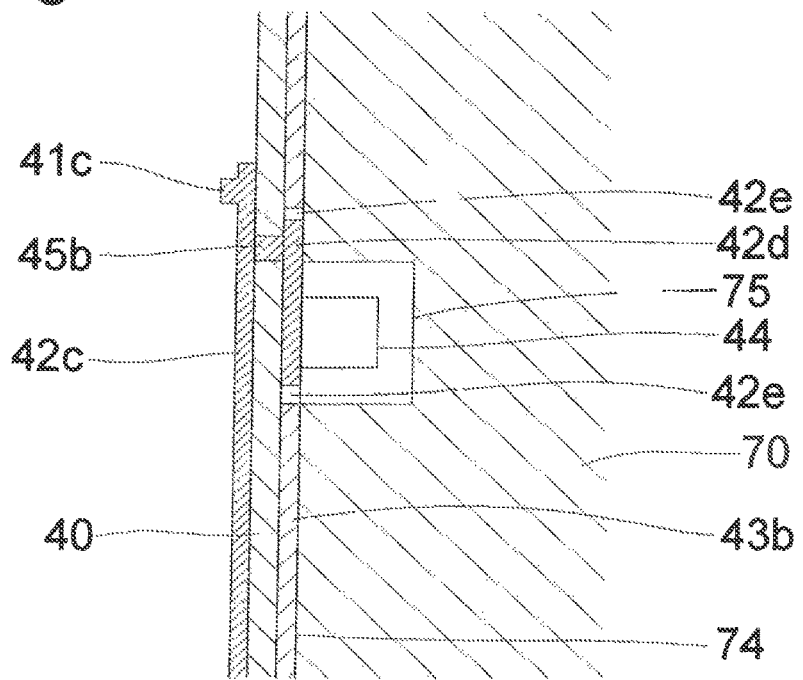
FIG. 12 is a sectional view taken along a line B-B in FIG. 11.

FIG. 1 is an exploded perspective view of a contact unit 30 according to a first embodiment of the present invention, as seen from the above. FIG. 2 is an exploded perspective view of the contact unit 30, as seen from the below. FIG. 3 is an exploded perspective view of an inspection jig 1 according to the embodiment of the present invention, as seen from the above. FIG. 4 is an exploded perspective view of the inspection jig 1, as seen from the below. FIG. 5 is a perspective view of the inspection jig 1 in which a unit pressing member 90 is omitted, as seen from the above. FIG. 6 is a perspective view of the inspection jig 1 in which the unit pressing member 90 is omitted, as seen from the below. FIG. 7 is an enlarged view of a central portion of a face (a lower face), which is a face side of an object to be inspected, of a flexible substrate 40 of the inspection jig 1. In FIG. 7, a recess 75 of a block 70 shown in FIG. 1 is indicated by a broken line. FIG. 8 is an enlarged view of a central portion of a face (an upper face), which is a face side of a tester, of the flexible substrate 40. FIG. 9 is an enlarged sectional view taken along a line A-A in FIG. 7 in a state incorporated in the block 70. FIG. 10 is an enlarged view of an electronic component 44 in FIG. 9 and the periphery thereof. FIG. 11 is an enlarged view where the central portion in FIG. 7 is further enlarged. Also in FIG. 11, similarly to FIG. 7, the recess 75 of the block 70 is indicated by a broken line. FIG. 12 is a sectional view taken along a line B-B in FIG. 11.

The contact unit 30 is an exchangeable contact unit for an inspection jig such as a probe card and, detachably fixed to a main substrate 10 of the inspection jig 1, as shown in FIGS. 3, 4, and so on. The contact unit 30 includes a flexible substrate 40, four coaxial connectors 50 such as SMA connectors, a sub-substrate 60 acting as a support member in the form of a hard substrate such as a glass epoxy substrate for example, and the block 70 formed of a resin molding, for example. The block 70 is provided for supporting a contact between the flexible substrate 40 and an object to be inspected. Therefore, when pressing the flexible substrate 40 against the object to be inspected, the block 70 needs to securely press the flexible substrate 40 against the object to be inspected to support the flexible substrate 40 immovably. Hence, the block 70 has to be made of a hard material and to be made of a high-workability material for forming the recess 75 for the electronic component 44. For example, a material such as polyimide or polyimide-amide is optimal.

The flexible substrate 40 is provided for coming into contact with an object to be inspected such as a wafer. The flexible substrate 40 is positioned on one face (a lower face) of the sub-substrate 60. The flexible substrate 40 includes a cross-shaped part whose lower face (a face opposite to the sub-substrate 60) having a central portion. The central portion is a contact region 41 to be contacted with the object to be inspected such as the wafer, as shown in FIG. 1. The contact region 41 includes bumps (contact portions) as shown in FIGS. 7 and 11, more specifically, high-speed signal bumps 41a, low-speed signal bumps 41b, a power supply bump 41c, and a ground bump 41d.

Each of signal transmission conductive patterns is drawn from each of the bumps except the ground bumps 41d. More specifically, each of high-speed signal patterns 42a is drawn from each of the high-speed signal bumps 41a. The high-speed signal patterns 42a are directly and electrically connected by soldering, etc. to signal legs 52 of the coaxial connectors 50. Ground patterns 43a are arranged on both sides of and in the vicinity of the high-speed signal patterns 42a. The ground patterns 43a extend from ground patterns (not shown in the drawings) around the coaxial connectors 50 to the vicinity of the high-speed signal bumps 41a so as to configure a coplanar line together with the high-speed signal patterns 42a sandwiched therebetween. Each of the ground patterns 43a is electrically connected to a ground pattern 43b on the back side of the flexible substrate 40 via ground through-holes 45a. The ground bump 41d is electrically connected to the ground pattern 43b on the back side of the flexible substrate 40 via through-holes provided at the same positions as the positions of the ground bumps 41d.

Each of low-speed signal patterns 42b is drawn from each of the low-speed signal bumps 41b. A power supply pattern 42C is drawn from the power supply bump 41c. The low-speed signal patterns 42b and the power supply pattern 42c are electrically connected one-to-one to through-holes 45c (FIG. 2, etc.) provided at ends of the cross-shaped part of the flexible substrate 40. The through-holes 45c are provided for electrical connection with the main substrate 10.

As shown in FIG. 12, the power supply pattern 42c is electrically connected to an electronic component mount pad 42d on the opposite face of the flexible substrate 40 via a power supply through-hole 45b. The power supply through-hole 45b is provided at a position different from the position of the power supply bump 41c but in the vicinity of the power supply bump 41c, when viewed from a direction orthogonal to a planar portion 74 of the block 70 (when the flexible substrate 40 is viewed from the planar portion 74 of the block 70). Although the electronic component 44 can be arranged most closely by forming the power supply bump 41*c* and the power supply through-hole 45*b* at the same position, the electronic component 44 may separate from the flexible substrate 40 since a force is applied to the power supply bump 41*c* and simultaneously to the power supply through-hole 45*b* and then to the electronic component 44 by contact with the object to be inspected. Hence, the power supply bump 41*c* and the power supply through-hole 45*b* are arranged at different positions.

As shown in FIG. 8, the ground pattern 43*b* is provided over the entire upper face (a face side of the tester) of the flexible substrate 40, except the electronic component mount pad 42*d* and a pattern non-formation region 42*e*. The electronic component mount pad 42*d* is insulated from the ground pattern 43*b* by the pattern non-formation region 42*e*. The electronic component 44 is provided so as to extend across the electronic component mount pad 42*d* and the ground pattern 43*b*, and has one terminal electrode electrically connected to the electronic component mount pad 42*d* by soldering or the like and the other terminal electrode electrically connected to the ground pattern 43*b* by soldering or the like. The electronic component 44 is, for example, a chip capacitor functioning as a bypass capacitor to eliminate noise on the power supply pattern 42*c* (the electronic component 44 causes noise to flow into the ground pattern 43*b* so as to prevent noise from flowing toward the power supply bump 41*c*).

The flexible substrate 40 has, in addition to the above, connector leg through-holes 46, screw fastening through-holes 47 and 48, and positioning through-holes 49, as shown in FIGS. 1 and 2. The connector leg through-holes 46 are provided for inserting the signal legs 52 and ground legs 53 of the coaxial connectors 50 to the connector leg through-holes 46. The screw fastening through-holes 47 are provided for inserting screws (fastening members) 107 that fix the contact unit 30 to the main substrate 10 of the inspection jig 1. The screws 107 shown in FIGS. 1 and 2 need not be constituent elements of the contact unit 30. The screw fastening through-holes 48 are provided for inserting screws (fastening members) 108 that fix the unit pressing member 90 of the inspection jig 1 shown in FIGS. 3 and 4 to the main substrate 10. The screw fastening through-holes 48 are arranged on both sides, respectively, of the through-holes 45*c*. The positioning through-holes 49 are provided for inserting positioning pins 109 (FIG. 4) positioning the contact unit 30 relative to the main substrate 10. The positioning through-holes 49 are provided next to the screw fastening through-holes 48. When attaching the contact unit 30 to the inspection jig 1, the flexible substrate 40 is not joined to the main substrate 10, which will be described later, by means of soldering or the like.

The four coaxial connectors 50 are directly and electrically connected to the flexible substrate 40 at positions surrounding the contact region 41 of the flexible substrate 40, while coaxial cables which are extended from an inspection device (a tester), which is not shown in the drawings, can be detachably connected to the four coaxial connectors 50. Each of the coaxial connectors 50 includes a main body 51, the signal leg 52, and four of the ground legs 53. One end of the coaxial cable is connected to the inspection device, and the other end of the coaxial cable is detachably connected (attached) to the main body 51. The main body 51 is positioned on the other face (an upper face) of the sub-substrate 60. A flange 51*a* of the main body 51 is fixed to a connector fixing land (omitted in the drawings) of the sub-substrate 60 by soldering or the like. The signal leg 52 and the ground legs 53 are extended from the main body 51 through connector leg through-holes 66 in the sub-substrate 60 and connector leg through-holes 46 in the flexible substrate 40, and then, directly and electrically connected to the face of the flexible substrate 40 at an opposite side to the sub-substrate 60 by soldering or the like. More specifically, the signal leg 52 is directly and electrically connected to the high-speed signal pattern 42*a* of the flexible substrate 40, and the ground legs 53 are directly and electrically connected to the ground patterns 43*a* of the flexible substrate 40. When the contact unit 30 is attached to the inspection jig 1, the coaxial connectors 50 are not joined to the main substrate 10, which will be described later, by means of soldering or the like.

The sub-substrate 60 as a support member (a support substrate) is provided for the purpose of preventing a large load from being applied to junctions (soldered portions) between the flexible substrate 40 and the coaxial connectors 50 when attaching the coaxial cables to the coaxial connectors 50 or when detaching the coaxial cables from the coaxial connectors 50. The sub-substrate 60 has a center through-hole 61, the connector leg through-holes 66, screw fastening through-holes 67, and positioning through-holes 69. The center through-hole 61 provides a space for arranging the block 70. The connector leg through-holes 66 are provided for inserting the signal leg 52 and the ground legs 53 of the coaxial connector 50 into the connector leg through-holes 66. The screw fastening through-holes 67 are provided for passing screws 107 for fixing the contact unit 30 to the main substrate 10 of the inspection jig 1. The positioning through-holes 69 are provided for inserting the positioning pins 109 (FIG. 4) for positioning the contact unit 30 relative to the main substrate 10.

The block 70 is urged downward by a spring 91 in a state incorporated in the inspection jig 1, thereby to hold the flexible substrate 40 in such a state that the contact region 41 is protruded downward from the lower face of the main substrate 10. The block 70 has four legs 72 around a center truncated pyramid 71 that is convexed downward. A parallelism adjusting screw 73 is attached to each of the legs 72 of the block 70. The tip end of the parallelism adjusting screw 73 comes into contact with a block base 22 of a retainer 20 which will be described later. Vertical position of the block 70 which is urged by the spring 91 is determined by the contact of the tip end of the parallelism adjusting screw 73 with the block base 22 of the retainer 20. Two positioning pins 103 are held by the block 70 to be projected upward. The positioning pins 103 has a function of positioning the unit pressing member 90, which will be described later, relative to the contact unit 30. Although the spring 91 is shown at an upper side than the block 70 in FIG. 2, the spring 91 may be held by the unit pressing member 90 of the inspection jig 1 by adhesion or the like, and need not be absolutely a constituent element of the contact unit 30. The block 70 has a planar portion 74 at the top of the truncated pyramid 71. The planar portion 74 abuts on the back side of the contact region 41 of the flexible substrate 40. In addition, the block 70 has a recess 75 concaved from the planar portion 74. The electronic component 44 mounted on the flexible substrate 40 is located within the recess 75. When viewed from the direction perpendicular to the planar portion 74, the recess 75 is provided at a position in the vicinity of the power supply bump 41*c* (a bump (a contact portion) which is electrically connected to the electronic component 44) except an overlapping position with the power supply bump 41*c*. Therefore, as shown in FIG. 12, the planar portion 74 of the block 70 abuts immediately at the back side of the power supply bump 41c.

The inspection jig 1 is a probe card for example, and is used for inspecting electrical performance of a semiconductor integrated circuit in the form of a wafer. The inspection jig 1 includes the main substrate 10 formed of a glass epoxy substrate for example, the metal retainer 20 formed of metal such as stainless steel or the like for example, the above described contact unit 30, and the unit pressing member 90 formed of a resin molded body for example.

As shown in FIG. 4, the main substrate 10 is provided with a contact through-hole 11, through-holes 15, connector leg through-holes 16, and screw fastening through-holes 17 and 18. The contact through-hole 11 is provided for allowing the contact region 41 of the flexible substrate 40 to protrude downward. The through-holes 15 are provided for establishing electrical connections with the through-holes 45c of the flexible substrate 40. The connector leg through-holes 16 are provided for avoiding the signal legs 52 and the ground legs 53 of the coaxial connectors 50. The screw fastening through-holes 17 are provided for passing the screws 107 for fixing the contact unit 30 to the main substrate 10. The screw fastening through-holes 18 are provided for passing the screws 108 for fixing the unit pressing member 90 to the main substrate 10. A ground pattern not shown in the drawings is provided on the upper face (the face opposed to the flexible substrate 40) of the main substrate 10 around the connector leg through-holes 16 and the screw fastening through-holes 17. By fastening the contact unit 30 to the main substrate 10 with the screws 107, the ground pattern of the main substrate 10 and the ground pattern of the flexible substrate 40 come into face-to-face contact with each other. The two ground patterns are provided around the screw fastening through-holes 17 and 47, so that the patterns are firmly brought into fact-to-face contact with each other, particularly in regions around the portions where they are fastened with the screws 107.

As shown in FIG. 4, the retainer 20 is a thin metal plate, for example, and has a function of restricting a downwardly protruding amount of the contact unit 30 from the main substrate 10. The retainer 20 is attached (fixed) to the lower face of the main substrate 10 with screws (fastening members) 106. The retainer 20 is provided with a cross-shaped contact through-hole 21 and screw holes 27 and 28. The block bases 22 (FIG. 4) are formed around the contact through-hole 21. The contact through-hole 21 is provided for allowing the contact region 41 of the flexible substrate 40 to protrude downward. The screw holes 27 are adapted to be engaged with the screws 107 for fixing the contact unit 30 to the main substrate 10 of the inspection jig 1. The screw holes 28 are adapted to be engaged with the screws 108 for fixing the unit pressing member 90 to the main substrate 10. The block bases 22 are respectively located below the legs 72, of the block 70, and receive (support) the tip ends of parallelism adjusting screws 73 which are attached to the legs 72 and extended downward from the legs 72. Positioning pins 104 and the positioning pins 109 are provided on the retainer 20 and projected upward from the upper face of the main substrate 10. The positioning pins 104 have a function of positioning the unit pressing member 90 relative to the main substrate 10. The positioning pins 109 have a function of positioning the contact unit 30 relative to the main substrate 10. The main substrate 10 and the retainer 20 form the main body of the inspection jig 1.

The unit pressing member 90 is a member for pressing the contact unit 30 from the above. As shown in FIG. 4, the unit pressing member 90 is provided with positioning through-holes 93 and 94, connector body through-holes 95, and a spring recess 96 (FIG. 3). The positioning through-holes 93 are provided for passing the positioning pins 103 for positioning the unit pressing member 90 relative to the contact unit 30. The positioning through-holes 94 are provided for passing the positioning pins 104 for positioning the unit pressing member 90 relative to the main substrate 10. The connector body through-holes 95 are provided for protruding the main bodies 51 of the coaxial connectors 50 upward. The spring recess 96 is provided for supporting one end of the spring 91 which is shown in FIG. 2. The spring 91 urges the block 70 downward (that is, urges the contact region 41 of the flexible substrate 40 downward) in a state where the unit pressing member 90 is fixed to the main substrate 10 with the screws 108, thereby to apply a contact force against an object to be inspected such as a wafer to the contact region 41 of the flexible substrate 40. Two elastic members 92 (FIG. 3) formed of silicone rubber or the like in a shape of a cord (a linear shape) are held on the lower face (the face opposed to the flexible substrate 40) of the unit pressing member 90. The elastic members 92 are provided at positions just above the through-holes 45c of the flexible substrate 40 and the through-holes 15 of the main substrate 10, and press the through-holes 45c of the flexible substrate 40 toward the through-holes 15 of the main substrate 10 in a state where the unit pressing member 90 is fixed to the main substrate 10 with the screws 108. Since the screws 108 fix the unit pressing member 90 to the main substrate 10 at both sides of the elastic member 92 respectively, pressing effects of the elastic member 92 are enhanced. The through-holes 15 and 45c are brought into pressure contact with each other by the elastic members 92 thereby to be electrically connected.

An assembly flow of the inspection jig 1 will be described hereinbelow.

As a first step, the contact unit 30 is assembled in advance. Specifically, the following steps are carried out. The signal legs 52 and the ground legs 53 of the coaxial connectors 50 are passed through the connector leg through-holes 66 of the sub-substrate 60 so that the flanges 51a of the coaxial connectors 50 are fixed to the connector fixing lands, which are not shown in the drawings, on the upper face of the sub-substrate 60 by soldering or the like. Afterward, while the signal legs 52 and the ground legs 53 of the coaxial connectors 50 are passed through the connector leg through-holes 46 in the flexible substrate 40 mounted with the electronic component 44 and having the block 70 adhered thereto, simultaneously the flexible substrate 40 is set on the lower face (the face at an opposite side to the face where the main bodies 51 of the coaxial connectors 50 are fixed) of the sub-substrate 60. The signal legs 52 and the ground legs 53 of the coaxial connectors 50 are then directly and electrically connected to the lower face (the face at the opposite side to the sub-substrate 60) of the flexible substrate 40 by soldering or the like. It is also possible to fix flanges 51a of the coaxial connectors 50 to the upper face of the sub-substrate 60, after the signal legs 52 and the ground legs 53 of the coaxial connectors 50 are electrically connected to the lower face of the flexible substrate 40 in advance. The flexible substrate 40 is indirectly fixed to the sub-substrate 60 since the signal legs 52 and ground legs 53 of the coaxial connectors 50 are fixed to the sub-substrate 60 by soldering. In this manner, the assembly of the contact unit 30 is thus completed. The block 70 may be passed through the center through-hole 61 of the sub-substrate 60, and fixed to the back side of contact region 41 of the flexible substrate 40 by adhesion, in a final step.

The contact unit 30 is then attached (fixed) to the main substrate 10 with the screws 107. More specifically, the four positioning pins 109 projected from the main substrate 10 are respectively passed through the positioning through-holes 49 in the flexible substrate 40 and the positioning through-holes 69 in the sub-substrate 60, while the four screws 107 are respectively passed through the screw fastening through-holes 67 in the sub-substrate 60, the screw fastening through-holes 47 in the flexible substrate 40, and the screw fastening through-holes 17 in the main substrate 10, and screwed into the screw holes 27 in the retainer 20 which has been fixed to the lower face of the main substrate 10 in advance. As a result, the flexible substrate 40 is sandwiched between the main substrate 10 and the sub-substrate 60.

The unit pressing member 90 is then fixed to the main substrate 10 with the screws 108. More specifically, the two positioning pins 103 which are projected upward from the block 70 and the two positioning pins 104 which are projected upward from the main substrate 10 are respectively passed through the positioning through-holes 93 and 94 in the unit pressing member 90, while the four screws 108 are passed through the through-holes in the unit pressing member 90, the screw fastening through-holes 48 in the flexible substrate 40, and the screw fastening through-holes 18 in the main substrate 10, and screwed into the screw holes 28 in the retainer 20. The parallelism of the contact region 41 of the flexible substrate 40 is adjusted by turning the parallelism adjusting screws 73, according to necessity. In this manner, the assembly of the inspection jig 1 is thus completed. The contact unit 30 can be detached from the main substrate 10 by performing the assembling works in reverse order.

Figure 15:
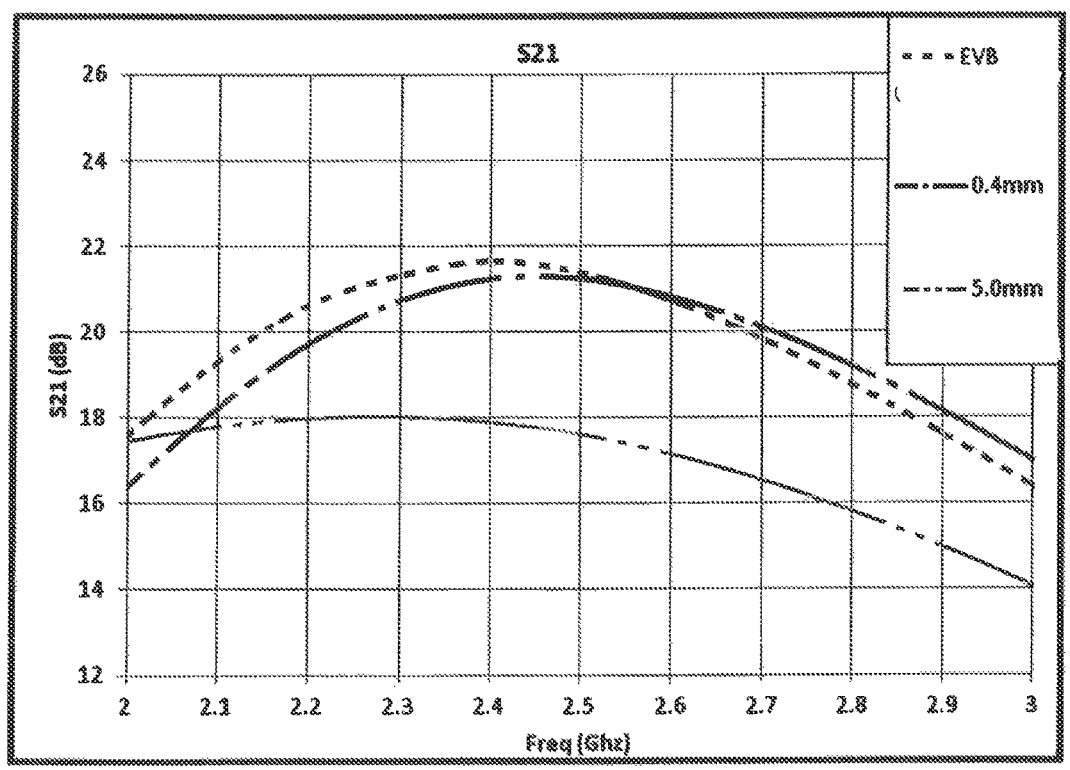
FIG. 15 is a characteristic view showing the results of measurements of power pass characteristics (S21 of S-parameters) from an input to an output of a 2.5 GHz amplifier as the object to be inspected, the measurements being made in a range of 2 GHz to 3 GHz by varying a position of a chip capacitor as the electronic component 44.

FIG. 15 is a characteristic view showing the results of measurements of power pass characteristics (S21 of S-parameters) from an input to an output of a 2.5 GHz amplifier as the object to be inspected, the measurements being made in the range of 2 GHz to 3 GHz by varying a position of a chip capacitor as the electronic component 44. Three characteristics shown in FIG. 15 are actual measurement values of an evaluation substrate, simulation values with a distance (length of the power supply pattern) of 0.4 mm between the electrode (electrode on the power supply pattern 42c) of the electronic component 44 and the power supply bump 41c in the configuration of the embodiment, and simulation values with a distance of 5 mm between the electrode of the electronic component 44 and the power supply bump 41c in the configuration of a comparison example, respectively. The evaluation substrate has a power supply bump and a power supply pattern, with a distance of 0.5 mm between the power supply bump and an electrode (electrode on the power supply pattern) of a chip capacitor provided on the power supply pattern which is extended from the power supply bump. The configuration of the comparison example is such the recess 75 is removed from the block 70 in the embodiment and such that the electronic component 44 is provided on the same face as the contact region 41 in the flexible substrate 40 and on the lateral side of the truncated pyramid 71 of the block 70 for avoiding the interference with an object to be inspected during the measurements. The distance of 5 mm is a minimum distance between the electronic component 44 and the power supply bump 41c in the configuration of the comparison example where the electronic component 44 is arranged so as to prevent any interference with the object to be inspected during the measurements. According to FIG. 15, it is found that the configuration of the embodiment can obtain characteristics similar to the actual measurement values of the evaluation substrate as a reference, as compared with the configuration of the comparison example. A matching circuit may be mounted as the electronic component 44.

According to this embodiment, the following effects can be obtained.

(1) Since the recess 75 concaved from the planar portion 74 is provided on the block 70 so that the electronic component 44 which is provided on the back side of the contact region 41 of the flexible substrate 40 is located within the recess 75, the electronic component 44 can be arranged closer to the target contact portion (power supply bump 41c in this case) while preventing any interference with the object to be inspected during the measurements, as compared with the case where the electronic component 44 is provided on the same face as the contact region 41 in the flexible substrate 40 and is provided on the lateral side of the truncated pyramid 71 of the block 70 for avoiding the interference with an object to be inspected during the measurements. For this reason, noise on the conductive pattern between the electronic component 44 and the power supply bump 41c can be reduced. Hence, accurate measurements (measurements of true device characteristics with small errors) can be performed even when the measurement object is a high-speed signal (high-frequency signal) of several GHz or more.

(2) Since the recess 75 is provided at a position different from the power supply bump 41c which is electrically connected to the electronic component 44 while the planar portion 74 of the block 70 abuts against just the back side of the power supply bump 41c, the power supply bump 41c can securely be pressed by the block 70 against the object to be inspected irrespective of the disposition of the recess 75.

Second Embodiment

Figure 13:
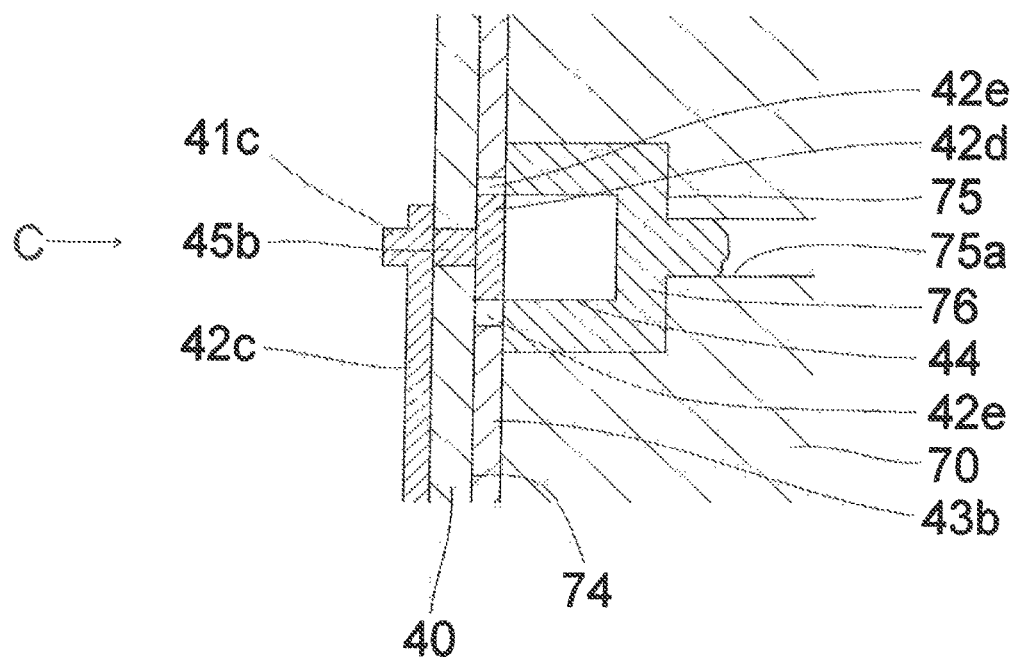
FIG. 13 is an enlarged sectional view of main parts of an inspection jig according to a second embodiment of the present invention.
Figure 14:
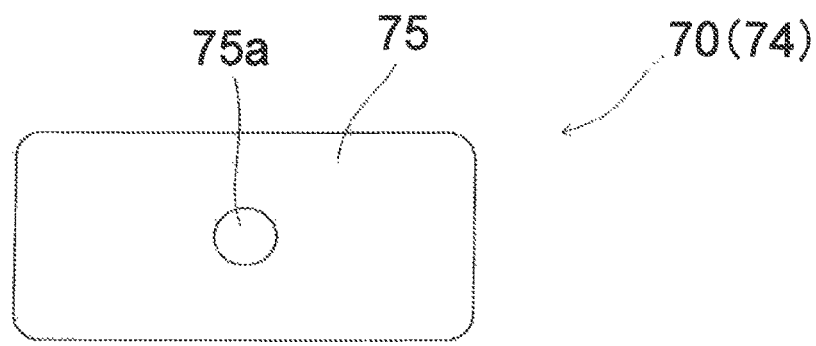
FIG. 14 is a fragmentary view of the block 70 in FIG. 13, as seen from a direction C in FIG. 13.

FIG. 13 is an enlarged sectional view of main parts of an inspection jig according to a second embodiment of the present invention. The section in FIG. 13 is a section taken through the power supply bump 41c, similar to FIG. 12. FIG. 14 is a fragmentary view of the block 70 in FIG. 13, as seen from a direction C in FIG. 13. The inspection jig in this embodiment is identical to that in the first embodiment except that the power supply through-hole 45b and the recess 75 of the block 70 are provided at the same position as the position of the power supply bump 41c, the recess 75 is filled with an insulating filler 76, and an escape hole 65a which is formed in a bottom face of the recess 75 at a substantially central portion is open. The filler 76 is an insulting resin that is solidified (coagulated) in a state where the electronic component 44 is located within the recess 75. The escape hole 75a is formed by machining or the like so as to pass through the block 70. The escape hole 75a has a function for letting the filler 76 which is extruded by the electronic component 44 entering the recess 75 escape when adhering the block 70 to the flexible substrate 40 mounted with the electronic component 44. According to this embodiment, even in the case where the electronic component 44 needs to be arranged on just the back side of the power supply bump 41c due to the physical constraints, a contact force required for the measurement can securely be applied to the power supply bump 41c due to the recess 75 filled with the filler 76.

Although the present invention has been described hereinabove referring to the embodiments as examples, it is to be understood by those skilled in the art that the constituent elements and processing processes in the embodiments are variously modified without departing from the scope defined by the appended claims. The modifications will be briefly described below.

The electronic component 44 may be another type of electronic component other than the capacitor such as a bypass capacitor. The electronic component 44 may be provided on a signal transmission bump (a contact portion) other than the power supply bump 41c.

It is also possible to use the inspection jig for inspecting the electrical performance of a semiconductor integrated circuit which is divided into individuals. The inspection jig may be one of such a type that the flexible substrate 40 is directly fixed to the main substrate 10 by soldering or the like without having the sub-substrate 60. Furthermore, parameters such as the number of the coaxial connectors 50, the number of through-holes, the number of screws used for fixing the respective parts, and the number of positioning pins are not limited to the specific numbers which are described as examples in the embodiments, but can be optionally defined according to the required performances and conveniences in designing.

What is claimed is:

1. A contact unit which can be attached to or detached from a main body of an inspection jig, the contact unit comprising:
   a flexible substrate having a contact region for electrically contacting an object to be inspected;
   a support member supporting the flexible substrate;
   a block located between the flexible substrate and the support member, wherein
      the block has a planar portion abutting the contact region of the flexible substrate,
      the block includes a concave recess opening at the planar portion,
      the contact region of the flexible substrate is electrically insulating and includes a back face, electrically conducting contact portions on the back face, a front face, at least one electrically conducting electronic component mount pad on the front face, and at least one electrically conducting through-hole electrically connecting a respective electrically conducting contact portion to the at least one electrically conducting electronic component mount pad, and,
      when the flexible substrate and the block are viewed perpendicular to the planar portion of the block, the electrically conducting contact portions are proximate, but do not overlap, the recess; and
   an electronic component located within the recess of the block, at the front face of the flexible substrate and electrically connected to one of the electrically conducting contact portions at the back face of the flexible substrate via the at least one electrically conducting through-hole and the at least one electrically conducting electronic component mount pad at the front face of the flexible substrate.

2. An inspection jig comprising:
   a flexible substrate having a contact region for electrically contacting an object to be inspected;
   a support member supporting the flexible substrate;
   a block located between the flexible substrate and the support member, wherein
      the block has a planar portion abutting the contact region of the flexible substrate,
      the block includes a concave recess opening at the planar portion,
      the contact region of the flexible substrate is electrically insulating and includes a back face, electrically conducting contact portions on the back face, a front face, at least one electrically conducting electronic component mount pad on the front face, and at least one electrically conducting through-hole electrically connecting a respective electrically conducting contact portion to the at least one electrically conducting electronic component mount pad, and,
      when the flexible substrate and the block are viewed perpendicular to the planar portion of the block, the electrically conducting contact portions are proximate, but do not overlap, the recess; and
   an electronic component located within the recess of the block, at the front face of the flexible substrate and electrically connected to one of the electrically conducting contact portions at the back face of the flexible substrate via the at least one electrically conducting through-hole and the at least one electrically conducting electronic component mount pad at the front face of the flexible substrate.

3. The inspection jig according to claim 2, wherein
   the flexible substrate has a conductive pattern on the front face electrically connected to the contact portions, and a ground pattern on the back face, and
   the conductive pattern and the ground pattern extend across the electronic component.

4. The inspection jig according to claim 2, wherein the recess is filled with an electrically insulating filler.

5. The inspection jig according to claim 2, wherein the contact portion that is electrically connected to the electronic component is a power supply contact portion.

6. The inspection jig according to claim 2, further comprising an urging member urging the block toward the object to be inspected.

7. The contact unit according to claim 1, further comprising an urging member urging the block toward the object to be inspected.

8. The inspection jig according to claim 2, wherein the electronic component is a bypass capacitor.

9. The inspection jig according to claim 3, wherein the contact potion that is electrically connected to the electronic component is a power supply contact portion.

10. The inspection jig according to claim 3, wherein the recess is filled with an electrically insulating filler.

11. The inspection jig according to claim 3, further comprising an urging member urging the block toward the object to be inspected.

12. The inspection jig according to claim 3, wherein
    the contact portions include conductive bumps, and,
    when viewed perpendicular to the planar portion of the block, the conductive bumps do not overlap the through-hole.

13. The inspection jig according to claim 12, wherein, when viewed perpendicular to the planar portion of the block, neither the through-hole nor the conductive bumps overlap the recess.

14. The inspection jig according to claim 4, wherein the contact portion that is electrically connected to the electronic component is a power supply contact portion.

15. The inspection jig according to claim 4, further comprising an urging member urging the block toward the object to be inspected.

16. The inspection jig according to claim 5, further comprising an urging member urging the block toward the object to be inspected.

17. An inspection jig comprising:
   a flexible substrate having a contact region for electrically contacting an object to be inspected;

a support member supporting the flexible substrate;
a block located between the flexible substrate and the support member, wherein
the block has a projection projecting toward the flexible substrate for pressing the flexible substrate toward the object to be inspected,
the projection has a planar surface abutting the contact region of the flexible substrate,
the projection includes a concave recess opening at the planar surface of the projection,
the contact region of the flexible substrate is electrically insulating and includes a back face, electrically conducting contact portions on the back face, a front face, at least one electrically conducting electronic component mount pad on the front face, and at least one electrically conducting through-hole electrically connecting a respective electrically conducting contact portion to the at least one electrically conducting electronic component mount pad, and,
when the flexible substrate and the block are viewed perpendicular to the planar surface of the projection of the block, the contact portions are proximate, but do not overlap, the recess; and
an electronic component located within the recess of the block, at the front face of the flexible substrate and electrically connected to one of the electrically conducting contact portions at the back face of the flexible substrate via the at least one electrically conducting through-hole and the at least one electrically conducting electronic component mount pad at the front face of the flexible substrate.

18. The inspection jig according to claim 17, wherein
the flexible substrate has a conductive pattern on the front face electrically connected to the contact portions, and a ground pattern on the back face,
the conductive pattern and the ground pattern extend across the electronic component,
the contact a portions include conductive bumps, and,
when viewed perpendicular to the planar surface of the block, the bumps not overlap the through-hole.

19. The inspection jig according to claim 18, wherein, when viewed perpendicular to the planar surface of the block, neither the through-holes nor the conductive bumps overlap the recess.

20. The inspection jig according to claim 17, wherein the electronic component is a bypass capacitor.

* * * * *